United States Patent
Shiba et al.

(10) Patent No.: US 7,776,689 B2
(45) Date of Patent: Aug. 17, 2010

(54) SEMICONDUCTOR DEVICE AND METHOD OF FABRICATING THE SAME

(75) Inventors: Katsuyasu Shiba, Yokkaichi (JP); Jota Fukuhara, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/196,038

(22) Filed: Aug. 21, 2008

(65) Prior Publication Data

US 2008/0311759 A1  Dec. 18, 2008

Related U.S. Application Data

(62) Division of application No. 11/136,508, filed on May 25, 2005, now abandoned.

(30) Foreign Application Priority Data

May 26, 2004  (JP) .............................. 2004-156214

(51) Int. Cl.
*H01L 21/8234* (2006.01)

(52) U.S. Cl. ........................ 438/257; 438/424; 438/781; 257/315; 257/316

(58) Field of Classification Search ................. 438/781, 438/780, 424, 435, 257; 257/646, 315–316, 257/E21.422, E29.03
See application file for complete search history.

(56) References Cited

U.S. PATENT DOCUMENTS

| | | | | |
|---|---|---|---|---|
| 5,859,458 A | * | 1/1999 | Hsueh et al. | ................. 257/347 |
| 2002/0168873 A1 | * | 11/2002 | Ahn et al. | .................... 438/781 |
| 2004/0198019 A1 | | 10/2004 | Yasui et al. | |
| 2005/0285179 A1 | * | 12/2005 | Violette | ...................... 257/315 |
| 2005/0285233 A1 | | 12/2005 | Huang et al. | |

FOREIGN PATENT DOCUMENTS

JP  3178412  6/2001

* cited by examiner

*Primary Examiner*—Theresa T Doan
(74) *Attorney, Agent, or Firm*—Oblon, Spivak, McClelland, Maier & Neustadt, L.L.P.

(57) ABSTRACT

A method of fabricating a semiconductor device including depositing a first silicon oxide film on a silicon substrate, depositing a silicon-containing film on the first silicon oxide film, applying a coating solution for silica film formation over the silicon-containing film, and heat-treating the coating solution, thereby forming a second silicon oxide film.

14 Claims, 7 Drawing Sheets

000000# SEMICONDUCTOR DEVICE AND METHOD OF FABRICATING THE SAME

CROSS-REFERENCE TO RELATED APPLICATIONS

This application is based upon and claims the benefit of priority from the prior Japanese Patent Application No. 2004-156214, filed on May 26, 2004, the entire contents of which are incorporated herein by reference.

BACKGROUND OF THE INVENTION

1. Field of the Invention

The present invention relates to a semiconductor device using a silica film forming coating liquid for forming a silica film and a method of fabricating the same.

2. Description of the Related Art

A degree of integration and miniaturization have recently been increased and miniaturization has recently progressed. With this, a size reduction in an element isolation region has been desired strongly. A shallow trench isolation (STI) structure has been employed in an increasing number of times to meet the needs. The STI structure can sufficiently render the element isolation region sufficiently small. As one of methods of burying a silicon oxide film ($SiO_2$) in an isolation groove in the STI, methods using a polysilazane film are known. For example, Japanese Patent No. 3178412 discloses one of the methods using the polysilazane film.

In the method disclosed in Japanese Patent No. 3178412, an $SiO_2$ film is formed on a surface of a silicon substrate and thereafter, a silicon nitride (SiN) film is formed on the $SiO_2$ film. Furthermore, an isolation groove is formed in the SiN film. Successively, the surface of the substrate is covered with a polysilazane solution (a solution of a silazane perhydride polymer in the above-noted reference) by spin coating. Subsequently, oxidation by substitution is carried out using $H_2O$ (in an atmosphere of steam) so that the polysilazane film is denaturalized to an $SiO_2$ film.

The following problem arises when the polysilazane film is applied to STI. In the oxidation by substitution in the atmosphere of steam, $H_2O$ reaches the substrate, oxidating the same. Oxidation of the substrate increases a thickness of the gate oxide film. Oxidation of the substrate further shrinks the polysilazane film. When the groove has a large width, the $SiO_2$ film peels off.

BRIEF SUMMARY OF THE INVENTION

Therefore, an object of the present invention is to provide a semiconductor device in which the silicon substrate can be prevented from oxidation and the silicon oxide film can be prevented from peeling off when the coating film is oxidated and a method of fabricating the same.

The present invention provides a semiconductor device comprising a silicon substrate, a first silicon oxide film deposited on the silicon substrate, a silicon-rich film deposited on the first silicon oxide film, and a second silicon film deposited on the silicon-rich film and formed by heat-treating a fluid applied for forming a silica coat.

The invention also provides a method of fabricating a semiconductor device, comprising depositing a first silicon oxide film on a silicon substrate, depositing a silicon-containing film on the first silicon oxide film, applying a coating solution for silica film formation over the silicon-containing film, and heat-treating the coating solution, thereby forming a second silicon oxide film.

BRIEF DESCRIPTION OF THE DRAWINGS

Other objects, features and advantages of the present invention will become clear upon reviewing the following description of the embodiment with reference to the accompanying drawings, in which.

DETAILED DESCRIPTION OF THE INVENTION

One embodiment of the present invention will be described with reference to FIGS. 1 to 7. In the embodiment, the invention is applied to a technique of burying an element isolation groove of the shallow trench isolation (STI) structure.

Figure 2:
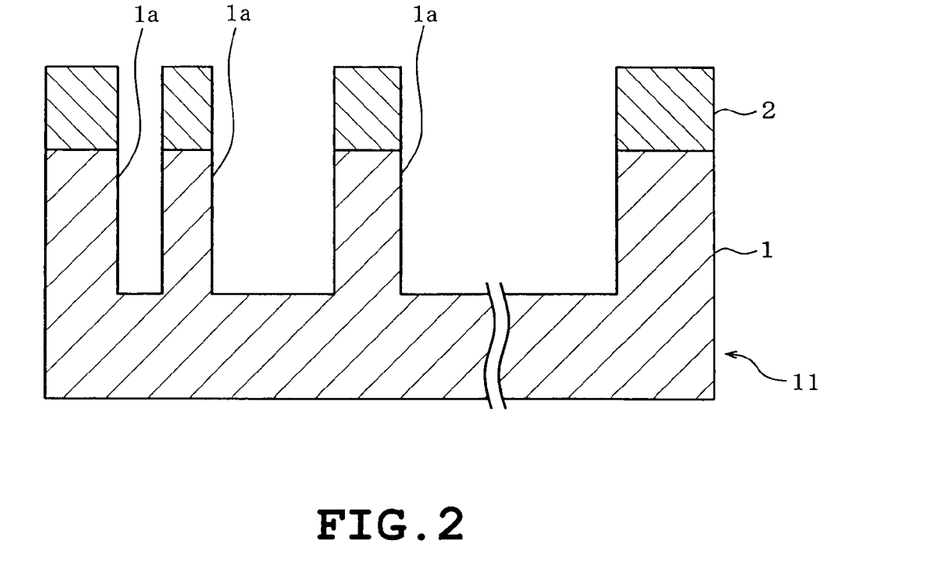
FIG. 2 is a longitudinal section of a grooved sample for evaluation.

Firstly, a grooved sample 11 for evaluation is prepared and has such a structure as shown in FIG. 2. The grooved sample 11 includes a silicon substrate 1 having an upper surface on which a silicon nitride (SiN) film 2 is deposited, for example, by 150 nm. Thereafter, for example, five grooves 1a are formed by the lithography and dry etching techniques. Three of the five grooves 1a are shown in FIG. 2. Each groove 1a has a depth of 450 nm, for example. Each groove 1a has a depth of 300 nm in the substrate 1. Furthermore, the five grooves 1a have widths of 100 nm, 500 nm, 1000 nm, 5000 nm and 10000 nm respectively.

Figure 3:
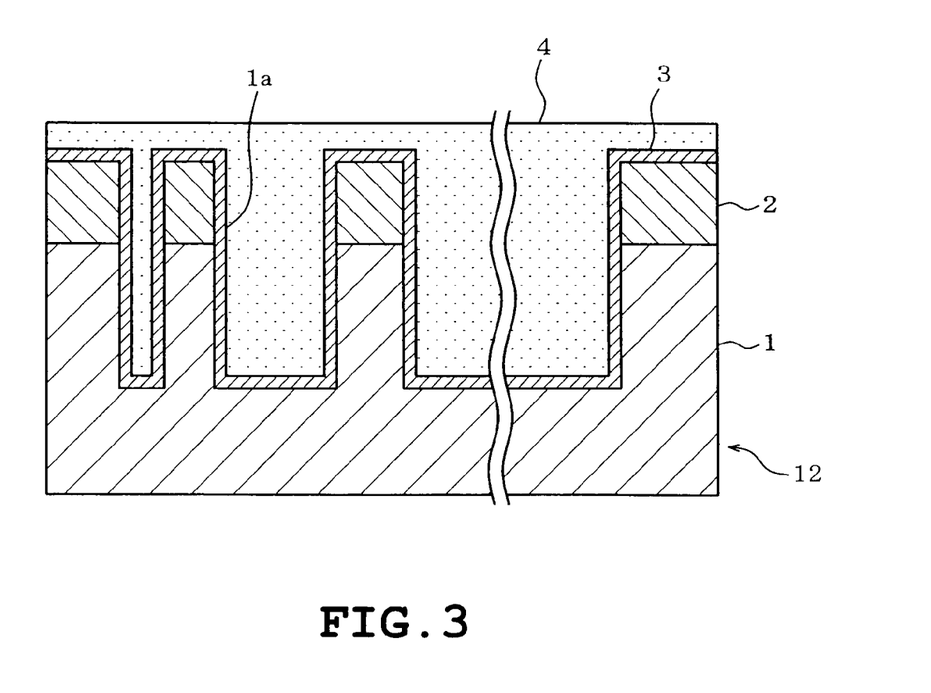
FIG. 3 is a longitudinal section of a first sample.

A silicon oxide ($SiO_2$) film 3 is deposited on the grooved sample 11 or the substrate 1, for example, by a high density plasma CVD (HDP) technique. The $SiO_2$ film 3 has a film thickness of 200 nm, for example. Subsequently, a polysilazane solution serving as a coating solution for silica film formation is applied to the $SiO_2$ film 3 by spin coating thereby to be formed into a polysilazane coating film 4. As a result, a first sample 12 as shown in FIG. 3 is formed. The first sample 12 corresponds to a conventional structure and a compared example to be compared with a sample of the embodiment (a second sample 13 as shown in FIG. 1).

The following is a condition for deposition of the $SiO_2$ film 3 using the HDP technique: the conditions of an $SiH_4/O_2$ gas flow and source power/bias power are represented as $SiH_4/O_2$=55/110 sccm and SRF/BRF=4400/2600 W.

Figure 1:
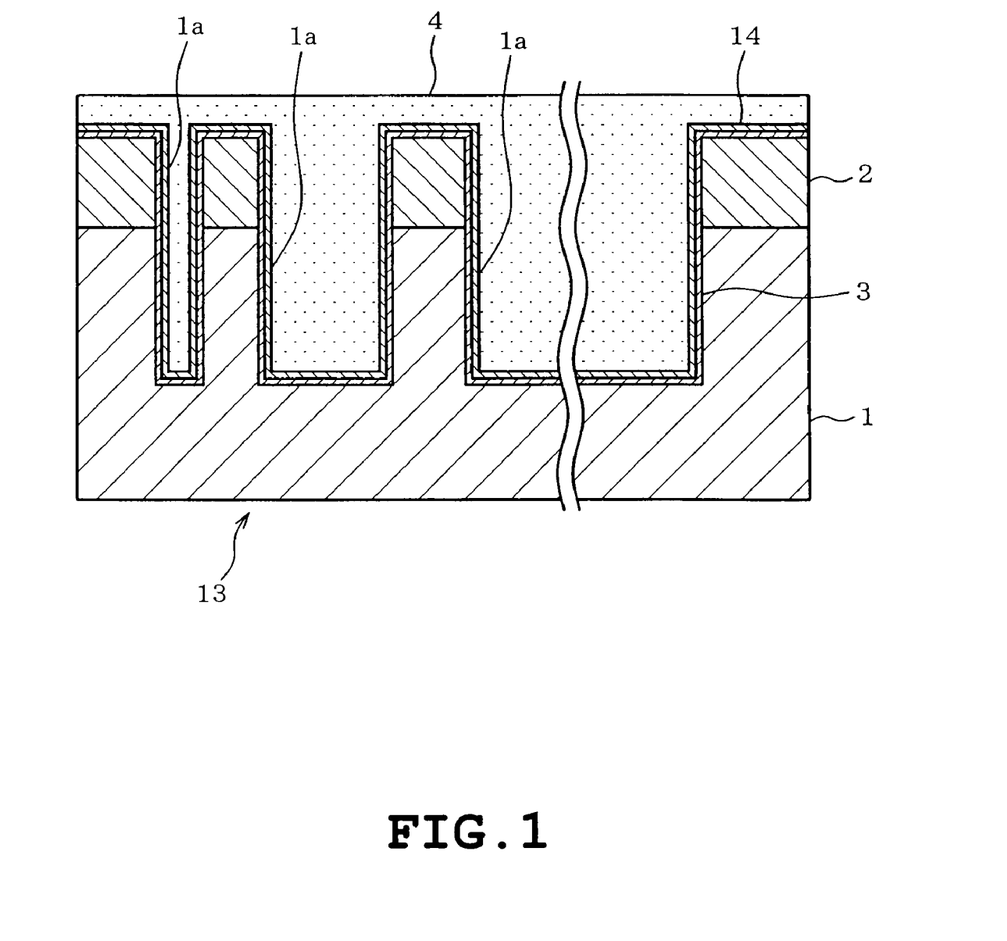
FIG. 1 is a longitudinal section of a second sample of a semiconductor device of one embodiment in accordance with the present invention.

A second sample 13 with a structure as shown in FIG. 1 is then formed. In this case, the $SiO_2$ film 3 is deposited by 200 nm on the grooved sample 11 with the foregoing structure using an HDP technique. Continually, an Si-rich film 14 is deposited by 100 nm, for example. Subsequently, a polysilazane solution is applied to the Si-rich film 14 by spin coating, thereby forming a polysilazane coating film 4. As a result, a second sample 13, which is a sample of the embodiment, is formed. The Si-rich film 14 constitutes a film containing Si.

The above-described Si-rich film 14 is a stoichiometrically silicon rich film and is composed of an Si-rich insulating film, for example, an Si-rich $SiO_2$ film. The silicon rich insulating film ($SiO_2$ film) has a refractive index ranging from 1.45 to 1.72. The reason for the setting of this range is that since Si has a refractive index of 1.72 and SiO2 has a refractive index of 1.45, the $SiO_2$ film becomes rich with Si if the SiO2 film has a refractive index ranges from 1.45 to 1.72.

In the embodiment, the conditions of an $SiH_4/O_2$ gas flow and source power/bias power are represented as $SiH_4/O_2$=55/110 sccm and SRF/BRF=4400/2600 W. A CENTURA-Ultima chamber manufactured by Applied Materials Inc. was used to make the aforesaid $SiO_2$ film 3 and Si-rich film 14.

For determination of the $SiO_2$ film 3 and Si-rich film 14, a film was formed using a bare-Si wafer apart from the aforesaid two samples 12 and 13. A refractive index was measured, and the determination of the $SiO_2$ film and Si-rich film 14 was made on the basis of the measured refractive index. More specifically, the $SiO_2$ film and Si-rich film were formed on the bare-Si wafer so as to each have a thickness of 400 nm, and then, the refractive index was measured. UV1280 Film Thickness Measurement System produced by KLA-Tencor Corporation was used for measurement of refractive index. Refractive indexes of the formed $SiO_2$ film and Si-rich film were 1.46 and 1.65 respectively.

Figure 6:
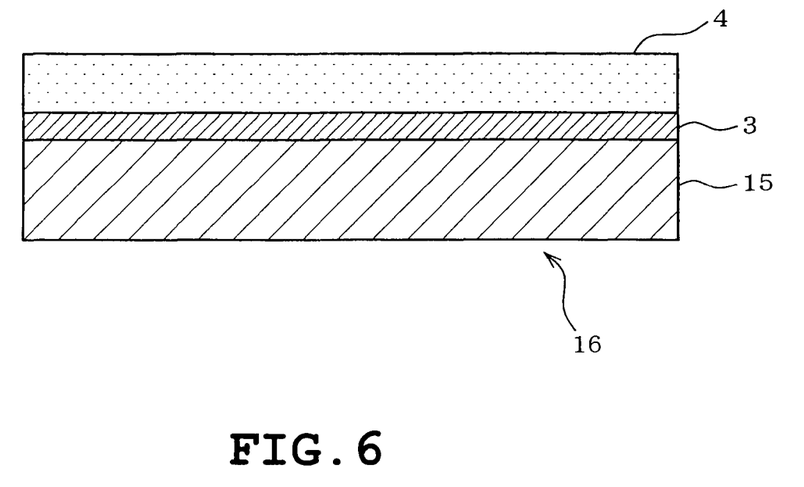
FIG. 6 is a longitudinal section of a third sample.

Furthermore, as shown in FIG. 6, a bare Si wafer 15 was prepared, and the $SiO_2$ film 3 was formed on the bare Si wafer 15 under the same condition as the above-described first sample 12. A polysilazane solution was applied to the $SiO_2$ film 3 to be formed into a polysilazane coating film 4. Thus, a third sample 16 was formed.

Figure 7:
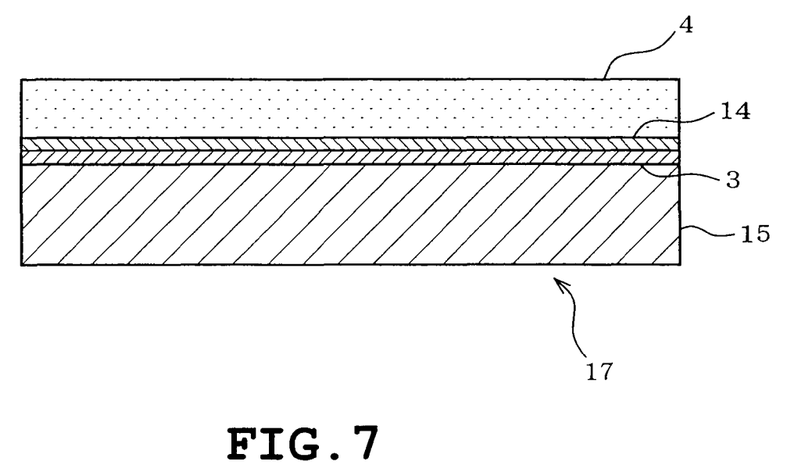
FIG. 7 is a longitudinal section of a fourth sample.

Additionally, as shown in FIG. 7, the bare Si wafer 15 was prepared, and the $SiO_2$ film 3 and Si-rich film 14 were formed under the same condition as the above-described second sample 13. A polysilazane solution was applied to the $SiO_2$ film 3 to be formed into a polysilazane coating film 4. Thus, a fourth sample 17 was formed.

Subsequently, the aforesaid four samples 12, 13, 16 and 17 of the polysilazane coating film 4 were processed for oxidation by substitution in an atmosphere of $H_2O$ (steam). More specifically, the four samples 12, 13, 16 and 17 were heat-treated as follows. An oxidizing furnace ALPHA-8SE-Z manufactured by Tokyo Electron Ltd. was used for the heat-treatment.

Firstly, the samples were heat-treated in an atmosphere of $H_2O$ at 400° C. for 15 minutes and thereafter, further heat-treated in an atmosphere of $O_2$ at 800° C. for 30 minutes. Subsequently, refractive indexes of the third and fourth samples 16 and 17 were 1.458 and 1.456 respectively. Consequently, it was confirmed that the polysilazane coating film 4 deposited on each of the samples 16 and 17 became an $SiO_2$ film. From the results of the third and fourth samples 16 and 17, it was confirmed that the polysilazane coating film 4 deposited on each of the first and second samples 12 and 13 also became an $SiO_2$ film.

Figure 4:
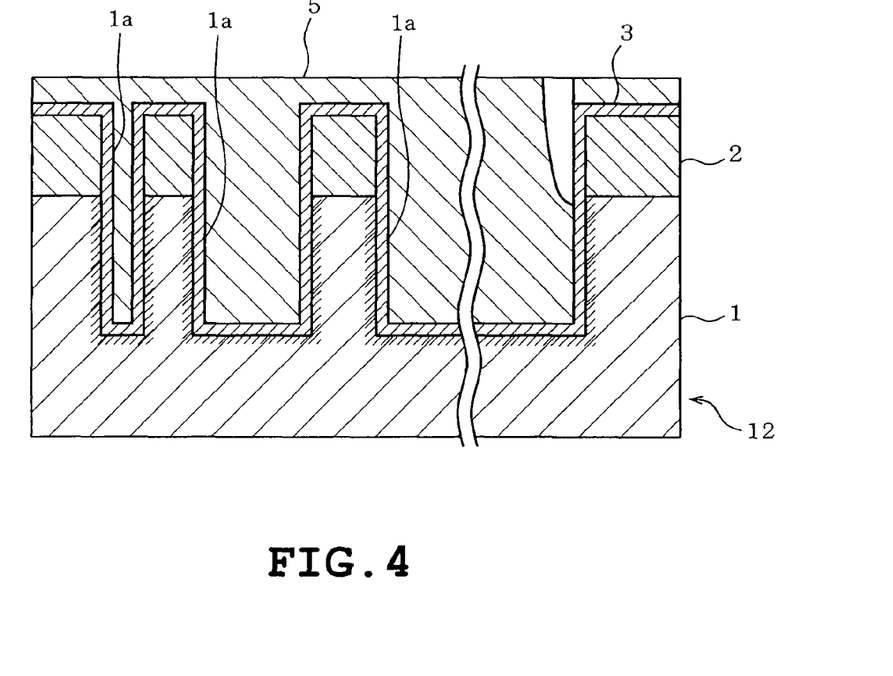
FIG. 4 is a longitudinal section of the first sample after heat treatment.

A section of the first sample 12 was observed using a scanning electron microscope (SEM). Type S-5200 manufactured by Hitachi, Ltd. was used as SEM. As the result of the observation, it was confirmed that the silicon substrate 1 was oxidated in each groove 1a of the first sample 12, as shown in FIG. 4. An oxidated region is shown by oblique lines in FIG. 4. Furthermore, it was confirmed that peeling occurred in a boundary between high density plasma (HDP)-SiO2 film 3 and the polysilazane coating film 4 ($SiO_2$ film) in a part of the groove 1a having a width of 10000 nm.

Figure 5:
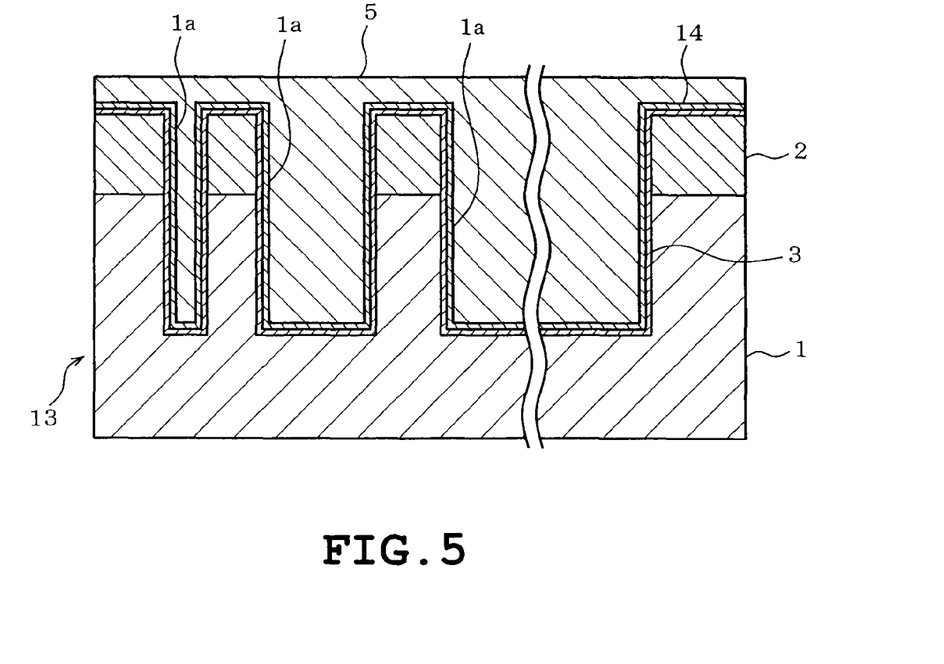
FIG. 5 is a longitudinal section of the second sample after heat treatment.

A section of the second sample 13 was also observed using SEM. No such fault as found in the first sample 12 was confirmed in the second sample 13 as shown in FIG. 5.

Causes of the fault in the first sample 12 will be considered. Firstly, a cause of oxidation on the substrate 1 of the first sample 12 will be described. When the polysilazane coating film 4 was oxidated, $H_2O$ reached the substrate 1 and oxygen (O) in $H_2O$ reacted with Si to form $SiO_2$. Furthermore, as for a cause of the peeling in the groove part with the width of 10000 nm, the polysilazane coating film 4 shrinks when Si—NH is oxidized into $SiO_2$. Accordingly, in the wide groove part where an absolute amount of shrinkage is large, the peeling occurs in a boundary between high density plasma (HDP)-SiO2 film 3 and the polysilazane coating film 4 ($SiO_2$ film).

On the other hand, the structure of the HDP-SiO2 film 3, Si-rich film 14 and polysilazane coating film 4 as the second sample 13 causes the following reaction: when $H_2O$ reaches the Si-rich film in the oxidation of the polysilazane coating film 4, oxygen of $H_2O$ reacts with the Si-rich film 14 to form $SiO_2$. Since oxygen is thus consumed, $H_2O$ does not reach the substrate 1. In this case, the Si-rich film 14 serves as a film with a function of preventing $H_2O$ or oxygen from permeation. Accordingly, the substrate 1 can be prevented from oxidation in the second sample 13.

Furthermore, the second sample 13 expands when SiO2 is formed by the reaction of oxygen with Si-rich film 14. The expansion compensates for the shrinkage of the second sample 13 when Si—NH of the polysilazane coating film is oxidated by substitution into $SiO_2$. Consequently, the peeling does not occur in the boundary between the HDP-SiO2 film 3 and the polysilazane coating film 4 ($SiO_2$ film).

The foregoing embodiment includes depositing the $SiO_2$ film 3 on the silicon substrate 1, depositing the Si-rich film 14 on the $SiO_2$ film, applying the polysilazane coating solution on the Si-rich film 14, and oxidating (heat-treating) the polysilazane coating film 14 by substitution. When H2O reaches the Si-rich film 14 in the oxidation of the polysilazane coating film 4 by substitution, oxygen of $H_2O$ reacts with Si to form $SiO_2$, whereupon oxygen is consumed.

Accordingly, since $H_2O$ is prevented from reaching the substrate 1, the substrate 1 can be prevented from oxidation. Furthermore, the cubic volume of the Si-rich film 14 is expanded when oxygen of $H_2O$ reacts with Si to form the $SiO_2$ film. The cubic expansion can compensate for cubic shrinkage resulting from film shrinkage of the polysilazane coating film 4 due to oxidation by substitution. Consequently, the peeling of the $SiO_2$ film can be prevented in the boundary between the HDP-SiO2 film 3 and the polysilazane coating film 4.

Figure 8:
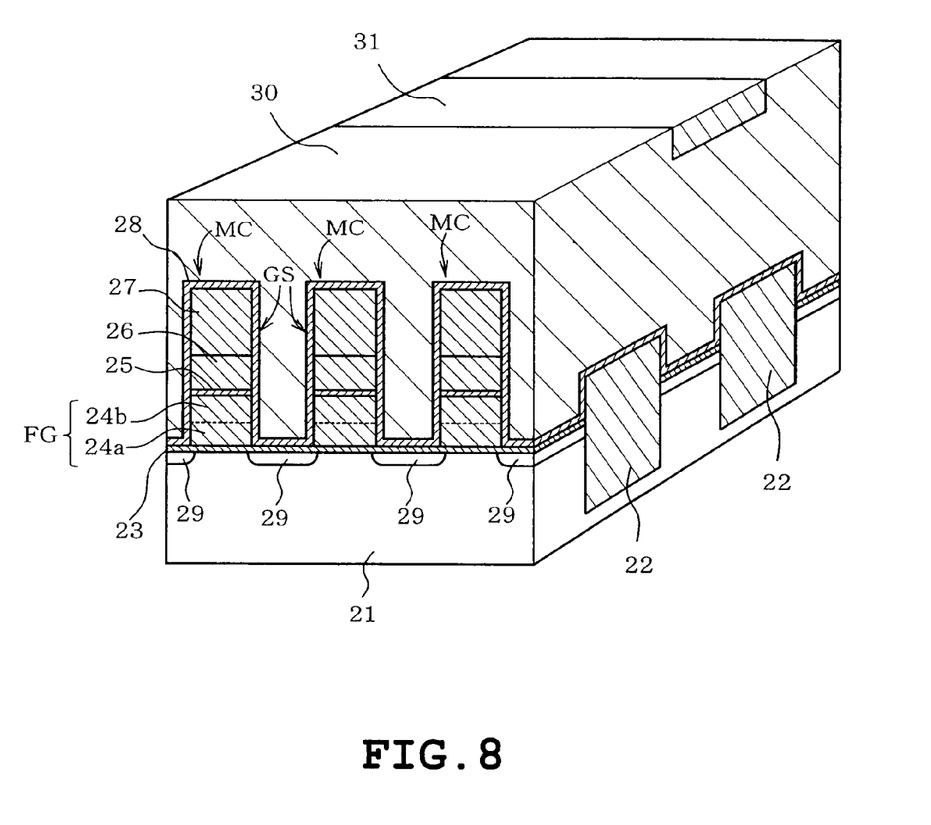
FIG. 8 is a perspective view of a NAND flash EEPROM.

The following describes a case where the foregoing fabricating method is applied to fabrication of a NAND-type flash EEPROM. In FIG. 8, each one of NAND cells comprises a plurality of series-connected memory cells MC. Each NAND cell is isolated by a shallow trench isolation structure including a buried insulating film 22 formed, for example, in a p-type semiconductor substrate 21.

In each memory cell MC, a gate oxide film 23 is formed on the surface of a semiconductor substrate 21. A first floating gate 24a comprising, for example, poly-silicon is formed on the gate oxide film 23. The first floating gage 24a constitutes a floating gate FG. A second floating gate 24b comprising, for example, poly-silicon is formed on the first floating gate 24a. The second floating gage 24b also constitutes the floating gate FG.

For example, an oxygen-nitride-oxygen (ONO) film 25 serving as a composite insulating film is formed on the second floating gate 24b. A control gate 26 comprising poly-silicon is formed on the ONO film 25. A mask 27 comprising a silicon nitride film is formed on the control gate 26. The mask 27, control gate 26 and first and second floating gates 24a and 24b are covered with a silicon nitride film 28, whereupon a gate structure GS is constituted.

An n-type diffusion layer 29 is formed in each part of the substrate 21 located between the gate structures GS. The diffusion layer 29 and the gate structure GS constitute each memory cell MC. The adjacent memory cells MC are connected in series to each other so as to own each diffusion layer jointly. The memory cells MC are covered with an interlayer insulating film 30 made from, for example, boro-phosphosilicate glass (BPSG). Wiring 31 made from tungsten, for example, is formed in the interlayer insulating film 30.

Figure 9A:
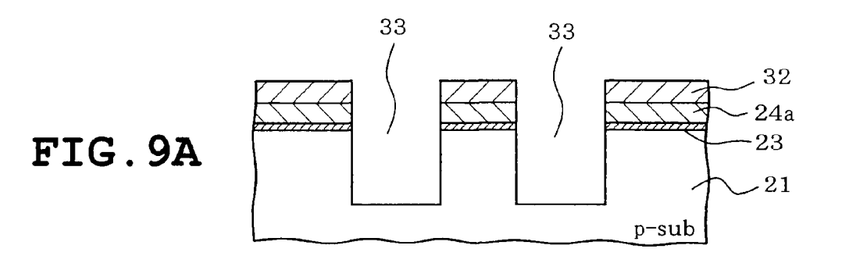
FIGS. 9A to 9D are longitudinal sections showing fabricating steps of the NAND flash EEPROM.

The fabrication step of the NAND-type flash EEPROM will be described with reference to FIGS. 9A to 10B. Firstly, as shown in FIG. 9A, on the surface of the substrate 1 are formed the gate oxide film 23, first floating gate 24a made from poly-silicon and mask 32 made from the silicon nitride film sequentially. Subsequently, the mask 32 is patterned, and the first floating gate 24a, gate oxide film 23 and substrate 21 are etched with the patterned mask 32 serving as a mask so that a plurality of trenches are formed.

Figure 9B:
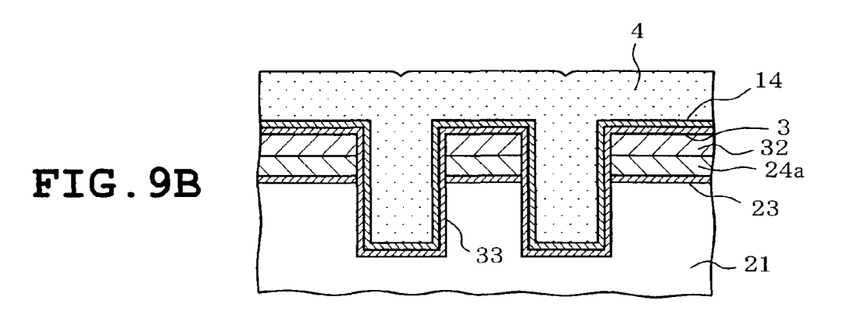

Subsequently, a process for forming a buried insulating film 22 in the trenches 33 or an STI structure forming step is carried out. This step is carried out in the same manner as the step of forming and heat-treating the second sample 13 as shown in FIG. 1. More specifically, firstly, the $SiO_2$ film 3 is deposited on the substrate 1 as shown in FIG. 9B. Successively, the Si-rich film 14 is deposited on the $SiO_2$ film 3. The film forming conditions for the $SiO_2$ film 3 and Si-rich film 14 are the same as described above.

Figure 9C:
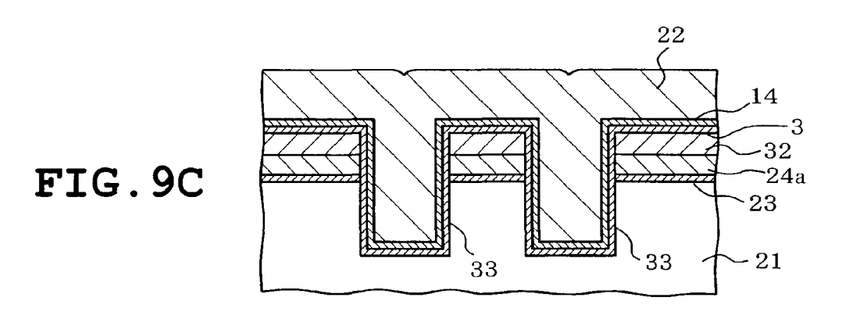
Figure 9D:
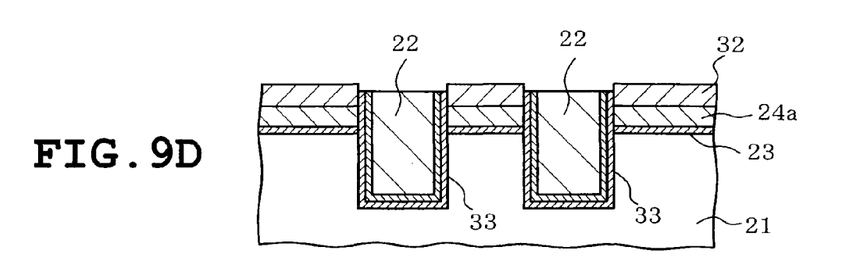

A polysilazane coating liquid is applied to the Si-rich film 14 by spin coating, thereby forming the polysilazane coating film 4. Thereafter, the polysilazane coating film 4 is oxidated by way of substitution or heat-treated to be formed into the $SiO_2$ film. The heat-treating conditions are the same as described above. As a result, as shown in FIG. 9C, the buried insulating film 22 comprising the $SiO_2$ film is formed, whereby the trenches 33 are filled. Subsequently, the aforesaid $SiO_2$ film (buried insulating film) 22 is flattened by chemical mechanical polishing with the mask 32 serving as a stopper.

Subsequently, the second floating gate 24b comprising, the surface of the $SiO_2$ film 22 in each trench 33 is etched by the dry or wet etching so as to be slightly lower than the surface of the mask 32. As a result, a step between the first floating gate 24a and the surface of the insulating film 22 is reduced. Subsequently, the mask 32 is removed.

Figure 10A:
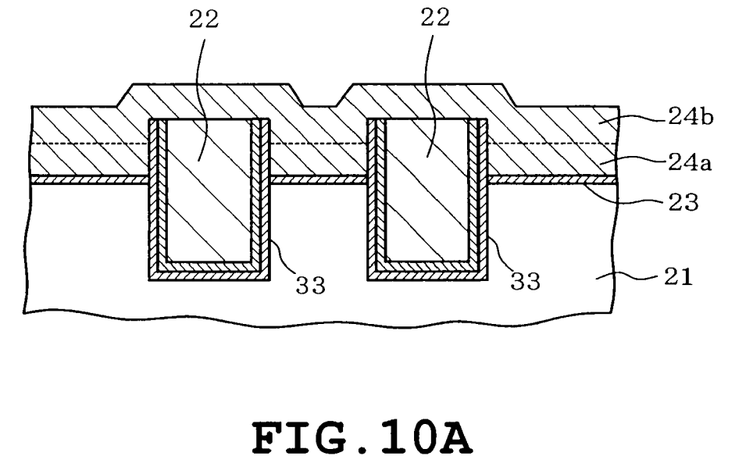
FIGS. 10A and 10B are longitudinal sections showing fabricating steps continuous to the step of FIG. 9D.
Figure 10B:
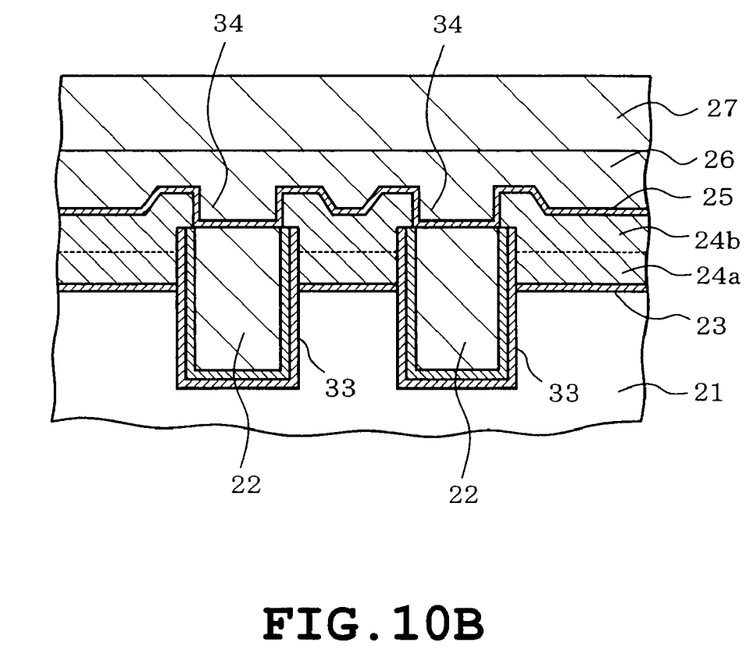

Subsequently, as shown in FIG. 10A, the second floating gate 24b comprising, for example, poly-silicon 8 is formed on the surface of the first floating gate 24a. Thereafter, the second floating gate 24b is patterned by the dry etching, and a slit 34 is formed in the upper surface of the buried insulating film 22 as shown in FIG. 10B. For example, the ONO film 25, the silicon gate (CG) 26 made from poly-silicon and the mask 27 are formed sequentially as a composite insulating film including the second floating gate.

Thereafter, as well known in the art, the mask 27 is patterned. Using the patterned mask 27, the poly-silicon composing the control gate 26 and the ONO film 25 are etched using the patterned mask 27. The mask 27, control gate 26 and first and second floating gates 24a and 24b are covered by the silicon nitride film 28, whereupon the gate structure GS is formed, as shown in FIG. 8.

Furthermore, the n-type diffusion layers 29 are formed in parts of the substrate 21 located between the gate structures GS. The n-type diffusion layers 29 serve as source or drain regions. Each memory cell MC is composed of the diffusion layer 29 and the gate structure GS. The memory cells MC are covered with an interlayer insulating film 30 made from, for example, BPSG. Wiring 31 made from tungsten and contact holes (not shown) are formed in the interlayer insulating film 30, whereupon a NAND-type flash EEPROM is fabricated.

The invention should not be limited to the foregoing embodiment. The embodiment may be modified or expanded as follows. Firstly, although the thickness of the Si-rich film 14 is 100 nm in the foregoing embodiment, the thickness of the Si-rich film may be set to a suitable value ranging from 10 nm to 500 nm according to a thickness of the polysilazane coating film 4.

A film containing Si, for example, an Si film may be deposited, instead of the Si-rich film 14.

An insulating film deposited under the Si-rich film 14 or the $SiO_2$ film has a thickness of 100 nm in the foregoing embodiment. However, the thickness of the $SiO_2$ film may be set to a suitable value ranging from 10 nm to 300 nm according to a thickness of the polysilazane coating film 4.

The $SiO_2$ film 3 deposited under the Si-rich film 14 is formed by the high density plasma (HDP) technique in the foregoing embodiment. However, for example, the plasma enhanced chemical vapor deposition (PECVD) technique or reflow burying technique may be employed, instead. Furthermore, the invention is applied to a burying technique for element isolation in the foregoing embodiment. However, for example, the invention may be applied to a burying technique for a space between the gate electrodes or for a space between metal wirings.

Furthermore, the coating liquid should not be limited to polysilazane. Any silica film forming liquid may be employed in which the oxide silicon whose characteristics are varied after the heat treatment is similar to the density of the oxide silica deposited by the high density plasma CVD.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A method of fabricating a non-volatile semiconductor memory device, comprising:
    forming a gate insulating film on a semiconductor substrate;
    forming a first polysilicon film on the gate insulating film;
    forming a mask material on the first polysilicon film;
    patterning the mask material;
    etching the first polysilicon film, the gate insulating film, and the semiconductor substrate with the patterned mask material thereby forming at least one trench;
    forming a first silicon oxide film on the mask material, the first polysilicon film, the gate insulating film, and the semiconductor substrate in the at least one trench;
    forming a silicon-rich silicon oxide film on the first silicon oxide film;
    forming a polysilizane coating film on the silicon-rich silicon oxide film;
    forming a second silicon oxide film by oxidation of the polysilazane coating film in a steam atmosphere;
    planarizing the first and second silicon oxide films with the patterned mask material as a stopper;
    removing the patterned mask material;
    forming an intergate insulating film on the patterned first polysilicon film; and
    forming a second polysilicon film on the intergate insulating film.

2. The method according to claim 1, wherein the oxidation of the polysilazane coating film is performed in an atmosphere of $H_2O$.

3. The method according to claim 1, wherein the oxidation of the polysilazane coating film is performed in an atmosphere at 400° C. for 15 minutes.

4. The method according to claim 1, wherein the polysilazane coating film is oxidized in a dry atmosphere after having been oxidized in the steam atmosphere.

5. The method according to claim 1, wherein the polysilazane coating film is oxidized in an atmosphere of $O_2$ at 800° C. for 30 minutes.

6. The method according to claim 1, wherein the mask material comprises a silicon nitride film.

7. The method according to claim 1, wherein the intergate insulating film comprises an ONO film.

8. A method of fabricating a non-volatile semiconductor memory device, comprising:
    forming a gate insulating film on a semiconductor substrate;
    forming a first polysilicon film on the gate insulating film;
    forming a mask material on the first polysilicon film;
    patterning the mask material;
    etching the first polysilicon film, the gate insulating film, and the semiconductor substrate with the patterned mask material thereby forming at least one trench;
    forming a first silicon oxide film on the mask material, the first polysilicon film, the gate insulating film, and the semiconductor substrate in the at least one trench;
    forming a silicon-rich silicon oxide film on the first silicon oxide film;
    forming a polysilizane coating film on the silicon-rich silicon oxide film;
    forming a second silicon oxide film by oxidation of the polysilazane coating film in a steam atmosphere at a first temperature;
    densifying the second silicon oxide film by a heat treatment at a second temperature higher than the first temperature;
    planarizing the first and second silicon oxide films with the patterned mask material as a stopper;
    removing the patterned mask material;
    forming an intergate insulating film on the patterned first polysilicon film; and
    forming a second polysilicon film on the intergate insulating film.

9. The method according to claim 8, wherein the first temperature is 400° C. and the second temperature is 800° C.

10. The method according to claim 8, wherein the oxidation of the polysilazane coating film is performed in an atmosphere of $H_2O$.

11. The method according to claim 8, wherein the densifying is performed in a dry atmosphere.

12. The method according to claim 8, wherein the densifying is performed in an atmosphere of $0_2$.

13. The method according to claim 8, wherein the oxidation of the polysilazane coating film is performed for 15 minutes.

14. The method according to claim 8, wherein the densifying is performed for 30 minutes.

* * * * *